United States Patent [19]
Edgar

[11] 3,947,636
[45] Mar. 30, 1976

[54] TRANSIENT NOISE FILTER EMPLOYING CROSSCORRELATION TO DETECT NOISE AND AUTOCORRELATION TO REPLACE THE NOISEY SEGMENT

[76] Inventor: Albert D. Edgar, 3217 Rock Hollow Road, Oklahoma City, Okla. 73120

[22] Filed: Aug. 12, 1974

[21] Appl. No.: 496,590

[52] U.S. Cl................ 179/1 P; 325/474; 328/163; 333/17 R
[51] Int. Cl.²........................................ H04B 15/00
[58] Field of Search ............ 179/1 D, 1 P, 100.2 K; 178/DIG. 12, 6.6 DC; 360/38; 325/65, 473, 474, 475, 476, 477; 328/162, 163, 165, 167, 143; 330/149; 333/17 R, 18

[56] References Cited
UNITED STATES PATENTS

| | | | |
|---|---|---|---|
| 2,996,576 | 8/1961 | Dolby | 360/38 |
| 3,057,960 | 10/1962 | Kaiser | 179/1 P |
| 3,387,222 | 6/1968 | Hellwarth et al. | 330/149 |
| 3,678,416 | 7/1972 | Burwen | 179/1 P |

Primary Examiner—Kathleen H. Claffy
Assistant Examiner—George G. Stellar
Attorney, Agent, or Firm—Robert M. Hessin

[57] ABSTRACT

A method and circuit for detecting transient noise pulses having predetermined characteristics which are contained in an input signal, and substituting for the portion of the input signal distorted by the noise pulse, an estimate of that portion based upon portions of the input signal outside the distorted portion.

19 Claims, 9 Drawing Figures

TRANSIENT NOISE FILTER EMPLOYING CROSSCORRELATION TO DETECT NOISE AND AUTOCORRELATION TO REPLACE THE NOISEY SEGMENT

BACKGROUND OF THE INVENTION

1. Field of the Invention

This invention relates generally to improvements in transient noise filters and, more particularly, but not by way of limitation, to a transient noise filter in which portions of an input signal distorted by transient noise pulses are replaced by an estimate of the input signal upon the detection of a transient noise pulse having predetermined characteristics.

2. Description of the Prior Art

Prior art noise filtration systems may be generally classified as frequency fitering, dynamic volume control, or clipping. Each of these types of circuits has disadvantages, however, when applied to the removal of transient noise pulses in such typical applications as the record playback or radio reception of audio signals such as music. Due to these limitations, none of these systems are fully satisfactory in such applications. Since such applications are perhaps the most demanding on noise filtration systems, the following discussion will be directed to the problems associated with the elimination from a program signal, such typical transient noise pulses as those caused by dust or scratches on the surface of a phonograph record or by radio static.

Frequency filtration systems remove predetermined frequency ranges under the assumption that the eliminated frequencies contain relatively more noise and less signal than the nonfiltered frequencies. While this assumption may be valid in general as to those frequencies filtered, these systems do not even attempt to remove the components of the noise lying within the non-filtered frequencies nor do they attempt to salvage any program signal from the filtered frequencies. In effect, these systems muffle the noise and also part of the program.

Dynamic volume control systems modify system gain as a function of the signal level thus passing fully only the louder, more noise resistant portions of the signal and suppressing the weaker portions. An extreme example of this system is utilized in the "squelch" circuit of radios. Although there will be the illusion of suppressing faint noise, the instantaneous signal to noise ratio is not improved, and there may be the illusion of actually amplifying noise transients which are louder than the program signal. In some of these systems, the volume change is greater at the higher frequencies, thus combining a type of frequency filtering with the dynamic volume control. However, the unnatural sound produced by this system must be overcome by boosting the volume of weaker passages of the program signal at the time it is being recorded, which amplifies during playback, the normal flutter in volume and frequency response variations caused by system imperfections.

Clipping circuits prevent the combined program signal plus noise from exceeding predetermined limits. Thus, as long as the magnitude of the signal remains within the limits, it is passed unaffected but the combined signal is clipped to the predetermined level when it contains noise components which are of sufficient magnitude to force the total magnitude beyond the limits. However, the program signal is similarly clipped when its magnitude exceeds the predetermined limits while noise up to the limits is passed unaffected. In some systems, the limits are dynamically varied as a function of signal magnitude. Sometimes, the output is set to zero or some other signal when the clipping limits are exceeded. However, since the limits should never be set lower than the current signal level waveform peak and in fact should allow a margin of safety for reasonable transients in the program signal, these systems in effect act only on noise which is greater in magnitude than the program signal and thus are of use only for controlling gross noise.

One such clipping circuit is disclosed in U.S. Pat. No. 3,700,812 issued to James C. Springett on Oct. 24, 1972. The Springett circuit utilizes either digital or analog devices to compare the amplitude of the envelope of the composite signal, as measured over a predetermined time period, to the instantaneous amplitude of the signal at the center of the predetermined time period, and, when the envelope amplitude is exceeded by the instantaneous amplitude, substitutes a pulse whose amplitude is either that of the envelope or a signal segment adjacent to the noise segment. This system is essentially a clipping circuit which varies the clipping level as a function of signal volume. Its ability to discriminate transient noise pulses is limited due to its simplistic approach. Further, the substitute signal represents at best a gross approximation of the desired signal.

Although combinations of the above described systems have been developed which have somewhat improved operating characteristics, the primary disadvantage remains that not all of the components of the noise pulse are effectively filtered or removed, and not all of the signal is passed. The result is still a discernable noise coupled with a loss of signal quality.

An effective transient noise filter should be capable of detecting noise pulses through the examination of more pulse characteristics than instantaneous amplitude and should substitute for the noise pulses a signal representing a good estimate of the noise distorted portion of the program signal.

SUMMARY OF THE INVENTION

The present invention contemplates a method and circuit for detecting transient noise pulses having predetermined characteristics which are contained in an input signal and substituting for the portion of the input signal distorted by the noise pulse, an estimate of that portion based upon portions of the input signal outside the distorted portion. In order to detect the noise pulse, the invention isolates from the input signal or an acceptable alternative input signal, those frequency ranges most likely to contain significant noise components, determines the envelope of the isolated portion, cross-correlates or convolves the envelope signal with a predetermined filter function which emphasizes the very rapid rise and especially decay rate of the envelope signal which is characteristic of a noise pulse, and provides a detection signal when the result of the convolution exceeds a predetermined threshold level indicating that a pulse having the predetermined pulse characteristics has been detected. In the absence of a noise pulse, the input signal, delayed an appropriate amount of time to allow for noise detection, is allowed to pass unaffected. Upon the detection of a noise pulse, the distorted portion of the input signal is replaced by an estimate signal which is a blend of the portions of the input signal before and after the distorted portion according to a desirable continuously varying weighting function, such as may be derived from the autocorrelation function of the input signal.

An object of the present invention is to provide a method and circuit for substantially eliminating transient noise pulses from an applied input signal.

Another object of the invention is to provide a more effective method and circuit for detecting transient noise pulses which are contained in an input signal.

Still another object of the invention is to provide an improved method and circuit for constructing a signal which is an estimate of and may be substituted for, a portion of an input signal containing a transient noise pulse.

One further object of the present invention is to provide an improved transient noise filter which applies an improved method and circuit to detect transient noise pulses which are contained in an applied input signal, and substituting for the distorted portion thereof, an estimate signal, constructed by an improved method and circuit, which represents a good estimate of the input signal without the noise.

Other objects and advantages of the invention will be evident from the following detailed description when read in conjunction with the accompanying drawings which illustrate the various embodiments of the invention.

GENERAL THEORY AND METHOD OF OPERATION

In order to facilitate the description of the method of construction and operation of the preferred embodiment of the invention, reference will be made as required in the description below to the figures in the following manner: references to the functional units of the invention will be made to the block diagram of FIG. 1; references to the characteristic response signals to a hypothetical applied input signal will be made to the graphs of FIG. 2; and references to the electrical components which comprise the preferred embodiment of the functional units of FIG. 1 will be made to the electrical circuits of FIGS. 3 through 9. Although the method and preferred embodiment of the present invention are illustrated and described below in relation to analog means to accomplish the invention, it is in no way limited to such apparatus since it is equally capable of being accomplished using various digital means including appropriate processing by a digital computer.

Figure 1:
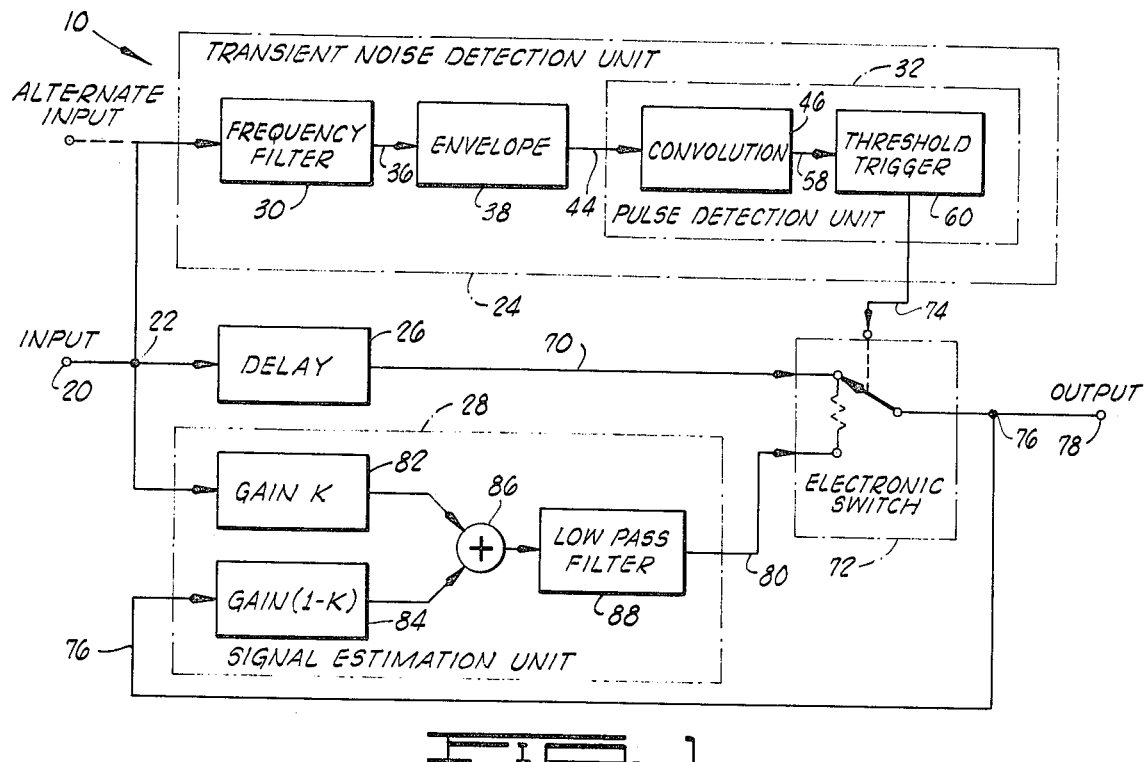
FIG. 1 illustrates in block diagram form the functional units comprising the preferred embodiment of the invention.

The present invention, shown generally in FIG. 1 as transient noise filter 10, is designed to accept an input signal from an external source such as a record player or a radio. The signal input from such a device will consist, in general, of a program signal and some undesirable noise components introduced by such sources as damaged or dirty record grooves or radio static. A segment of one such typical input signal is illustrated in graph 1 of FIG. 2. The input signal 12, consisting of program signal 14 and a noise pulse 16 of pulse width 18, will be used as an example to facilitate the explanation below of the method of operation of the invention. Input signal 12 displays the significant characteristics of thses types of signals - the program signal 14 contains both low and high frequencies and displays a typical percussion sound signal envelope which is fairly broad and has an especially slow rate of decay, while the noise pulse 16 contains predominantly high frequencies on the order of 12 KHz to 24 KHz but usually also contains low frequency components as illustrated. The envelope of noise pulse 16 displays a characteristic bell shape with a very rapid rate of decay relative to that of the program signal 14. This characteristic difference in the rate of decay of the signal envelope is one way that a human listener is able to distinguish between normal program transients such as percussion sounds, such as the one shown in Graph 1, which are subject to instrument resonance and air dispersion, and noise pulses caused by mechanical or electrical defects or interference which are not subject to such "mellowing" effects. The transient noise filter 10 also takes advantage of this characteristic in order to detect the undesirable noise pulses in a manner to be explained below.

As shown in FIG. 1, input signal 12 may be applied via input terminal 20 and signal path 22 to the transient noise detection unit 24, the signal delay unit 26 and the signal estimation unit 28 of the transient noise filter 10. However, since the noise detection unit 24 operates primarily on the envelope of the transient noise pulses contained in the applied input, there is no requirement for phase or even frequency matching between the signal applied to this unit and the signal applied to delay unit 26 and estimation unit 28. Ideally, the signal applied to noise detection unit 24 would be an alternate input signal containing relatively less program signal and more noise, so long as the occurrence times of the noise pulses are substantially the same. Examples of such alternate signals include the stereo difference signal from a monophonic record which contains little or no program signal but which is subject to the same scratches or "dust pops" as the sum signal, or, in radio static suppression, the signal received at a second, possibly empty, frequency channel which contains no program signal but is subject to the same causes of transient noise, such as automobile ignitions or lightning. For convenience in the discussion below, it will be assumed that input signal 12 is applied to noise detection unit 24 via signal path 22.

Within noise detection unit 24, the frequency filter 30 passes those frequencies of input signal 12 likely to contain significant noise components, a function normally accomplished by a high pass filter. Such a filter functions to accentuate the transient noise pulses. The ideal power transfer function of frequency filter 30 is approximately $$K \frac{N(\omega)}{S(\omega)} 2$$

wherein
  K = an arbitrary constant
  $N(\omega)$ = the power spectrum of the transient noise,
  $S(\omega)$ = the power spectrum of the remaining signal including program signal, system noise, and RF interference. Further, the power transfer function should have no sharp resonances which would excessively lengthen the transient noise pulse decay time and it should substantially attenuate those frequencies low enough to directly affect the pulse detection unit 32. The results of applying such a filter function to the input signal 12 is shown in graph 2 as HF filtered signal 34. A specific circuit designed to implement such a transfer function will be discussed in details below.

The HF filtered signal 34 is applied via signal path 36 to envelope unit 38 for determination of the signal envelope. This envelope is a function of the absolute value of the amplitude of the HF filtered signal 34. The simple absolute valve function of HF filtered signal 34 is shown in graph 3 as absolute value signal 40. Although the envelope of the absolute value signal 40 readily exhibits the characteristic rapid rise and decay rate of noise pulse 16, it is possible to further emphasize this characteristic by determining the logarithmic function of the absolute value signal 40. The envelope of such a log function is shown in graph 4 as log envelope signal 42 and clearly emphasizes the noise pulse 16. In addition, the use of the log function aids in making the detection independent of volume.

The output signal from envelope unit 38, preferably the log envelope signal 42, is applied via signal path 44 to the convolution unit 46 of pulse detection unit 32. Convolution unit 46 convolves or cross-correlates the log envelope signal 42 and a predetermined filter function in a manner well known in the art. This filter function should be selected so as to emphasize those transient pulses having pulse width within a predetermined range and displaying the rapid rise and decay rate characteristic of transient noise while rejecting normal program transients. Since the pulse detection unit 32 is less able to distinguish those noise pulses whose pulse width falls outside the predetermined pulse width range, the selection of this range should be made so as to insure that the predominance of expected noise pulses falls therein, but without encroaching upon the lower end of the pulse width range of normal program transients. Further, this pulse width range may vary from application to application. For example, for a record played at 33 rpm most noise pulses have pulse widths less than 400 $\mu$sec, while at 78 rpm the noise pulse width will normally be less than 200 $\mu$sec. Transient electronic noise may be much shorter. A representative convolution filter function, which may be considered as the circuit's impulse response curve shown reversed for convolution purposes, is shown in graph 5 as filter function 48.

As should be familiar to those skilled in the art, convolution is a method of "multiplying waveforms," such that, when similar waveforms are convolved, the resultant convolution signal exhibits greater response when the strong points of the two similar waveforms coincide. By analogy to a frequency filter, convolution may be considered as a "shape filter," which filters an applied waveform according to how well the waveform corresponds in shape to a predetermined filter shape or function. Therefore, filter function 48 in graph 5 represents the average shape of all transient noise pulse envelopes but with particular characteristics to inversely match the program transient envelopes. Thus, filter function 48 should emphasize the noise transients, even in the presence of program transients, when convolved with the log envelope signal 42.

During convolution, each point of filter function 48 is multiplied by a corresponding point of log envelope signal 42. In the positions of the waveforms shown in graphs 4 and 5, this multiplication is illustrated for three such corresponding points by the dotted lines 50. The product of all the multiplications is then summed or integrated to produce a single point on the convolution signal 52 of graph 6, as shown by dotted line 54. As the log envelope signal 42 shifts continuously with time, this process is repeated to produce the continuous convolution signal 52. As may be seen by the shape 56 in the convolution signal 52, the "shape filter" does emphasize the transient noise pulse.

Although there are other equivalent ways of performing the "shape filtering" function which are well known in the art, the present method generally should require fewer components and operations and thus is considered as the preferred method for the purposes of this description. For example, input signal 12 could be multiply delayed to make simultaneously available several points, such as those corresponding to the points indicated by dotted lines 50. These delayed signals may then have a frequency filter and an envelope function applied to each, to obtain the equivalent of points on the log envelope signal 42. These signals can then be combined through a resistor bridge constructed according to the corresponding points of filter function 48, to produce the equivalent of convolution signal 52. Such pulse detection circuits are considered as being equivalent to the pulse shape discrimination circuit described herein as the preferred embodiment.

The convolution signal 52 is, as shown in FIG. 1, applied via signal path 58 to the threshold trigger 60, such devices being generally well known in the art. As shown on graph 7 of FIG. 2, the threshold trigger 60 provides a detection pulse 62 on detection signal 64 as soon as the level of the applied convolution signal 52 exceeds a predetermined threshold level. The threshold level of trigger 60 is illustrated on graph 6 by the dotted line 66 on the convolution signal 52. This threshold level may be varied to satisfy the detection sensitivity required in a particular application. In order to allow time for the passage of the trailing edge of the noise pulse 16, the threshold trigger 60 may maintain the detection pulse 62 for a predetermined time period after the level of the convolution signal falls below the threshold level. This momentary "latching" effect would also tend to mask insignificant reversals in the neighborhood of the threshold level.

One variation which could be highly desirable in certain applications, would be to vary the threshold level as a function of the envelope of the input signal or selected frequencies thereof, in order to avoid introducing noticeable switching noise when a low level noise pulse is detected in the presence of a high level program signal. Another useful variation would be to provide a detection signal 64 which varies as a function of the amount that the convolution signal 52 exceeds the threshold level 66, i.e. change the level of the detection pulse 62 in steps or continuously, as the level of the convolution signal 52 fluctuates in excess of the threshold level 66. The usefulness of such a variable detection will be illustrated below.

Since filter function 48 incorporates both the pulse rise and fall characteristics of the noise pulse, it should be obvious that a noise pulse cannot be detected until after the decay portion of the waveform has passed. Thus, the peak value of the convolution signal 52 occurs well after the noise pulse 16 on input signal 12. The holding feature of the threshold trigger 60 incorporates a further delay from graph 6 to graph 7. It is highly desirable, therefore, to delay the input signal 12 a predetermined amount to allow time for the transient noise detection unit 24 to have available the entire noise pulse 16, both rise and fall, before deciding to trigger. Such a time delay has been applied to the input signal 12 to produce the delayed input signal 68 on graph 8. The time delay thus incorporated is also valuable in facilitating the construction of the estimation signal as described below, since the signal estimation unit 28 has available during the noise pulse 16, not only what the signal was before the pulse, but also what it will be after the pulse, thus allowing the use of the more accurate interpolation method in place of extrapolation.

Although the preferred embodiment utilizes a non-zero time delay function, such a delay is not required for the proper operation of the present method. For example, a different convolution filter function that does not "observe" fall characteristics can be substituted for the filter function 48. Using such a function, the transient noise detection unit 24 will detect noise pulses less accurately, but the detection will be essentially instantaneous, thus no time delay is required. The signal estimation process could still be based upon the autocorrelation function as described below, but the lack of information as to the future signal will make the estimation signal less accurate. Thus, the transient noise filter 10 will still function when the delay is a zero delay, and it should be understood that the amount of delay may be any realizable amount, including zero.

In FIG. 1, the input signal 12 is applied via signal path 22 to delay unit 26. As described above, the delay unit 26 delays the input signal 12 to allow the transient noise detection unit 24 time to operate, then applies the delayed input signal 68 of graph 8, via signal path 70, to one input terminal of electronic switch 72.

As shown in FIG. 1, the detection signal 64 is applied by the threshold trigger 60 via signal path 74 to the control input terminal of electronic switch 72. In the absence of detection pulse 62 from the threshold trigger 60, that is, when no noise pulse 16 has been detected, the delayed input signal 68 is allowed to pass unaffected through electronic switch 72 and via signal path 76 to the output terminal 78 of the transient noise filter 10. Upon detection of a noise pulse 16 and the application of detection pulse 62, electronic switch 72 switches from the delayed input signal 68 on signal path 70 to an estimate signal constructed by the signal estimation unit 28 and applied to the other input terminal of electronic switch 72 via signal path 80. Upon the termination of detection pulse 62, electronic switch 72 should switch back or reswitch to the delayed input signal 68. Electronic switch 72 should be constructed so as to switch and reswitch smoothly between the delay input signal 68 and the estimate signal under the control of transient noise detection unit 24, so that no noticeable switching noise is introduced into the output signal.

As described generally above, the detection of a noise pulse 16 by the transient noise detection unit 24 causes the electronic switch 72 to switch from the delayed input signal 68 to the estimate signal. This estimate signal would ideally be the program portion of the input signal without the distorting noise. However, since noise may exist at any frequency, it is best not to utilize any part of the noisy portion of the input signal in the construction of the estimate signal. The signal estimation unit 28, therefore, utilizes that portion of the delayed input signal 68 immediately preceding the noise pulse 16 and that portion of the input signal 12 immediately following the noise pulse 16. Thus the signal delay unit 26 performs the additional useful function of allowing the signal estimation unit 28 simultaneous access to both the delayed input signal 68 as it is output from electronic switch 72, which may be considered to be the "present" as far as the output is concerned, and to the input signal 12, which represents the "future" relative to the output signal. By utilizing both the imput and output signals, the signal estimation unit 28 is able to approximate by interpolation the program portion of the input signal which is distorted by the noise pulse 16, without relying on any part of the noisy portion. However, in addition to estimating the noise distorted program signal in frequency and amplitude, the estimate signal should accurately estimate phase in order to prevent step noise upon switching.

In the preferred embodiment, the signal estimation unit 28 estimates the program signal by interpolating across or "stepping over" the noisy portion of the input signal 12. The estimation signal can be based upon a dynamically changing blend of the input signal 12 before (derived ultimately from the delayed input signal 68) and after (derived from the input signal 12) the noise distorted portion. The ideal time weighting function to act upon the two portions may be derived from the autocorrelation function of the input signal 12. As is well known in the art, the autocorrelation function is a measure of how much, on the average, the signal at a given instant is related to the signal at an arbitrary time-distance away. It should be clear that when the "present" signal is available for use, it is its own perfect estimator. However during the interval of the transient noise pulse 16 when the "present" is unreliable, the autocorrelation function indicates how much each point of time of the non-noisy surrounding signal should count in estimating, based on an average signal, what the "present" signal would have been had the noise not been present.

The estimate "based on an average signal" is very good for low frequencies and the error is not critical at high frequencies, but for a signal having a wavelength near the width 18 of the noise pulse 16, the autocorrelation-based interpolation could miss an entire negative excursion, and thus detection and elimination of a faint noise in the presence of a strong signal of such a wavelength tends to be counterproductive. The signal estimation could be improved by determining continuously the ideal time weighting function from the autocorrelation of the actual signal near the scratch interval, or, more practically, by passing the band of offending frequencies around the estimation unit 28 through a very tight clipping circuit, extreme tightness being feasible because transients need not be passed, or by raising the detection threshold level in the presence of such frequencies.

Figure 2:
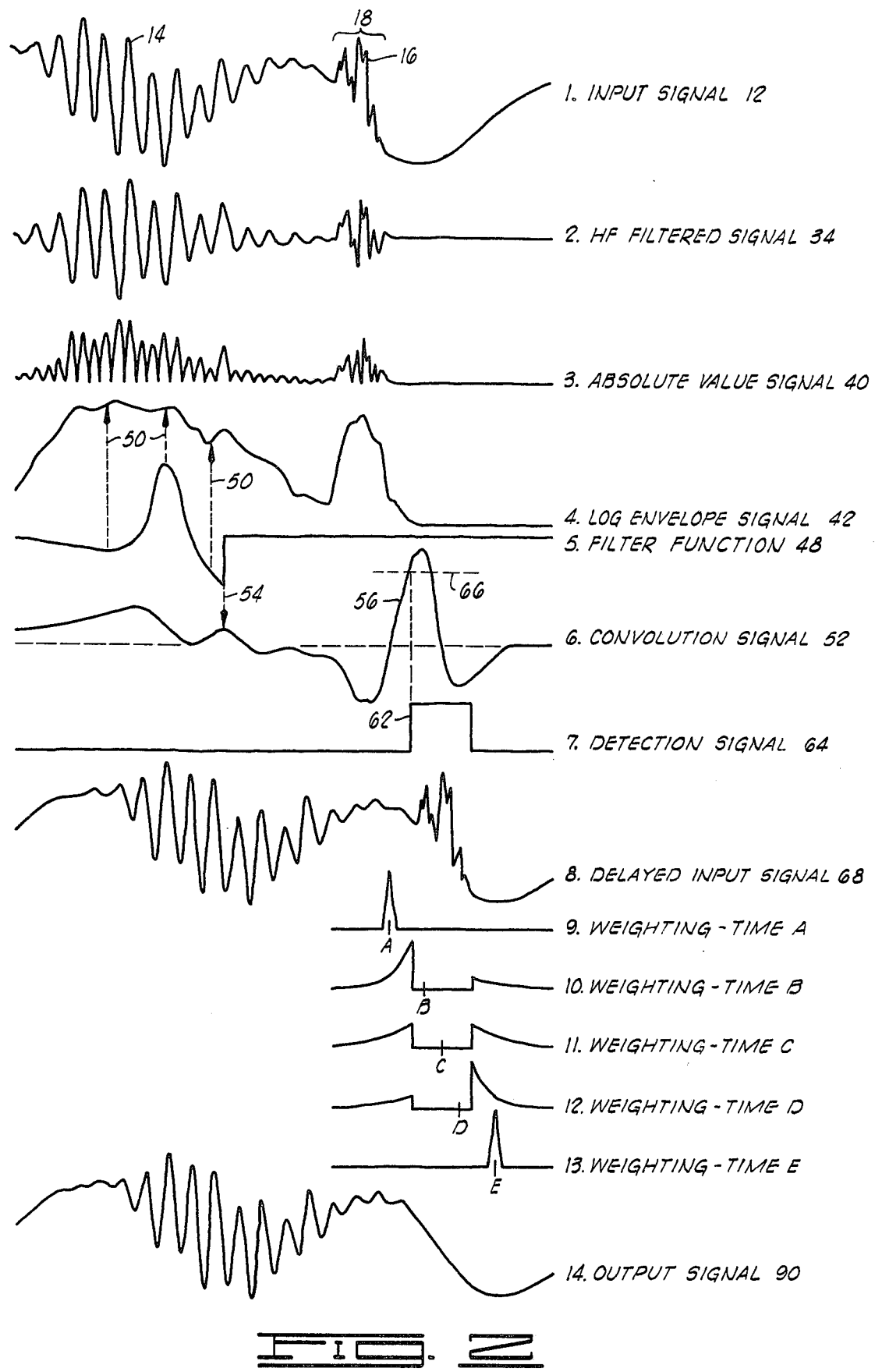
FIG. 2 is a multiline waveform diagram showing the operational characteristics of the invention.

The characteristics of a time weighting function based upon the autocorrelation function described above are illustrated graphically in graphs 9, 10, 11, 12 and 13 of FIG. 2 which show at selected times, the relative weight given the signal segments preceding and following a noise pulse interval. At point or time A of graph 9, the relative "present" is outside the noise pulse interval and may be passed intact, as indicated by the spike on the time weighting function. While this is the ideal estimation as explained above, it is most easily implemented by outputting the delayed input signal 68 itself. At time B of graph 10, the "present" has entered the signal segment that the transient noise detection unit 24 indicates contains noise, so that the "present" signal without noise is not directly available, but may be estimated by blending mostly that portion of the input signal preceding the noise interval with a little of the input signal following the noise interval. At time C of graph 11, the "present" is in the middle of the noise interval and may be estimated by blending relatively equal amounts of broader portions of the preceding and following signal segments. The widening of the weighting bands evident in graph 11 filters those high frequencies whose phase cannot be accurately estimated so far from a valid signal reference. At time D of graph 12, the estimation emphasis has shifted from the preceding to the following signal segment as compared with time B of graph 10. Finally, at time E of graph 13 the "present" has cleared the noise interval and may again be used directly. The area under each of the graphs 9 through 13 represents the same area (although it does not appear so, due to differing amplitude scales), so as to prevent impulse noise on switching, when the input signal contains a low frequency component.

In signal estimation unit 28, a portion of the "future" may be derived by applying the input signal 12 via signal path 22 to gain unit 82 which has a gain of K where K = 1. A portion of the "present" may be derived by applying the output of the electronic switch 72 via signal path 76 to gain unit 84 which has a gain of (1-K). Thus, the sum of the outputs of gain units 82 and 84, output from summer 86, exhibits a gain of unity over the original signals. The sum signal may then be applied to the minimum phase low pass filter 88. The continuous operation of estimation unit 28 allows the filter 88 to spread the sum signal back in time and thus maintain a portion of the immediate "past" for use when needed. Therefore, the estimate signal applied via signal path 80 to the second input of electronic switch 72 generally represents a blend of the "past," "present" and "future" relative to the delayed input signal 68. However, from the instant of noise detection and the switching of electronic switch 72, the "present" is eliminated from the feedback loop and its "past" decays as a transient, since it is no longer being updated from the delayed input signal 68. The "future," from the input signal 12, however, increases in strength by feedback or "bootstrapping" itself. The overall result is a dynamically changing blend which approximates the time weighting function illustrated in graphs 9–13. By varying the value of gain factor K, the speed of bootstrapping of the "future" and decay of the past may be controlled. If the gain units 82 and 84 also perform a frequency filtering function, as they do in the preferred embodiment, the gain constants K and (1-k) are specifically intended to refer to the gain of the low frequency pass band of the gain units.

Since feedback through the low pass filter 88 may cause the time weighting function to broaden excessively, with resultant step switching noise upon the return switching of electronic switch 72 back to the delayed input signal 68 when the noise pulse 16 has passed, the narrowing evident in the post-transient segment of the graph 12 relative to graph 11 may be approximated by providing a gradual return switching by electronic switch 72. The overall signal output from the transient noise filter 10, shown as output signal 90 on graph 14, thus consists of those portions of input signal 12 which do not contain distinguishable noise components and the estimates for those detected noisy portions which represent the interpolated estimate of the underlying program signal.

Although the preferred embodiment of the present invention is described herein as utilizing an interpolation method in performing the estimation function described above, it is to be understood that the present method is not so limited. It should be clear from the above discussion of the signal estimation unit 28 that an extrapolation method may be utilized by establishing the value of the gain factor K of gain unit 12 to be zero. Thus the gain of gain unit 84 would be one and the output thereof, when acted upon by the time spread function of low pass filter 88, will be an extrapolation based estimate of the input signal. Such an extrapolation-based estimate will usually be less accurate than the interpolation-based estimate, but it should suffice for many applications. Therefore, as explained above in the discussion of the transient noise detection unit 24, the time delay function of time delay 26 may be established at zero delay (thus depriving the signal estimation unit 28 functional access to the "future") without significantly impairing the effectiveness of the operation of transient noise filter 10 in many applications. The method of the present invention will operate under these conditions although the operation of both the transient noise detection unit 24 and the signal estimation unit will be somewhat less effective due to the considerations explained above.

If the detection signal 64 were to vary as a function of the amount that the convolution signal 52 exceeds the threshold level 66, as discussed above, the electronic switch 72 could be constructed to vary between the delayed signal 68 and the estimate signal as a function of the detection signal 64, thus providing the capability of directly controlling both the speed and extent of switching. Such a switch capability is illustrated in FIG. 1 by means of the dotted resistor connecting the internal switch input terminals of electronic switch 72. The illustration is drawn so as to imply the logical and electrical similarity to an electronically controlled potentiometer. The electronic gating structure described below as the preferred embodiment may be easily modified to facilitate such a variable speed blending operation.

In summary, the transient noise filter 10 may accept as input, a signal or signals containing components of program and noise. From these signals, those frequencies most likely to contain elements of noise are isolated and the envelope determined. As a result of convolving the envelope with a predetermined filter function, a threshold trigger is able to detect transient pulses having the narrow pulse width and rapid envelope rise and decay characteristic of noise pulses. Upon detection of a noise pulse, the output of the transient noise filter 10 is switched from the input signal, which has been delayed as necessary to allow noise detection, to an estimate signal constructed from an autocorrelation-based time-weighting function utilizing the reliable signal portion preceding the noise pulse and, if available, the portion following the noise pulse.

DESCRIPTION OF THE PREFERRED EMBODIMENT

Figure 3:
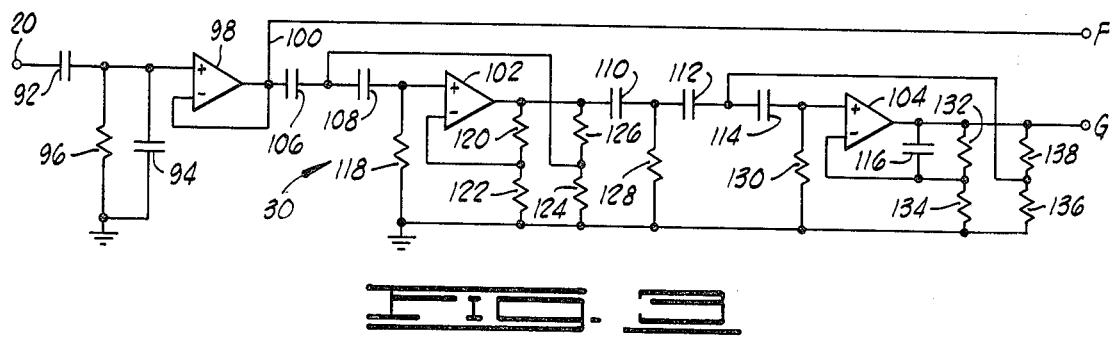
FIGS. 3, 4, 5, 6, 7, 8 and 9 are detailed circuit diagrams showing one embodiment of electronic components capable of accomplishing the invention.

Referring to FIG. 3, the input signal 12 applied to input terminal 20 is buffered, for convenience of interfacing, by capacitors 92 and 94, resistor 96 and operational amplifier (op-amp) 98 with the buffered input signal being made available for subsequent use via signal path 100 and intermediate terminal F. The buffered input signal is applied to the frequency filter 30 comprised of op-amps 102 and 104, capacitors 106, 108, 110, 112, 114 and 116, and resistors 118, 120, 122, 124, 126, 128, 130, 132, 134, 136 and 138. The embodiment of the frequency filter 30 shown satisifes the operational consideration described generally above, as the circuit can provide a rounded transmission peak at 24 KHz and a very rapid cutoff below 8 KHz. The HF filtered signal 34 is output from the frequency filter 30 via intermediate terminal G.

Figure 4:
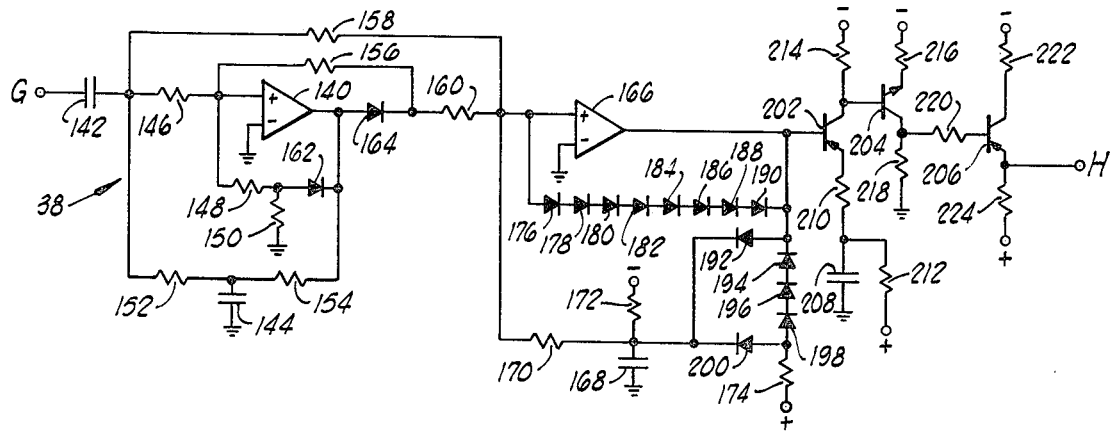

As shown in FIG. 4, the output of the frequency filter 30 is applied via terminal G to the envelope unit 38. The absolute value signal 40 is determined from the HF filtered signal 34 by op-amp 140, capacitors 142 and 144, resistors 146, 148, 150, 152, 154, 156, 158 and 160, and diodes 162 and 164. The logarithm of the absolute value signal 40 is determined by op-amp 166, capacitor 168, resistors 170, 172 and 174 and diodes 176, 178, 180, 182, 184, 186, 188, 190, 192, 194, 196, 198 and 200. In addition, the embodiments of both the absolute value and the logarithm circuits incorporate a self-nulling feature to automatically compensate biasing in the op-amps. The log envelope signal 42 is determined by transistors 202, 204 and 206, capacitor 208, and resistors 210, 212, 214, 216, 218, 220, 222 and 224, by outputting, via intermediate terminal H, a signal which may be described as the positive remainder after the log signal has from itself subtracted a signal approximating the low frequency envelope of the log signal crests. The more common aspects of the construction and use of absolute value, logarithm and envelope determining circuits should be familiar to those skilled in this art.

Figure 5:
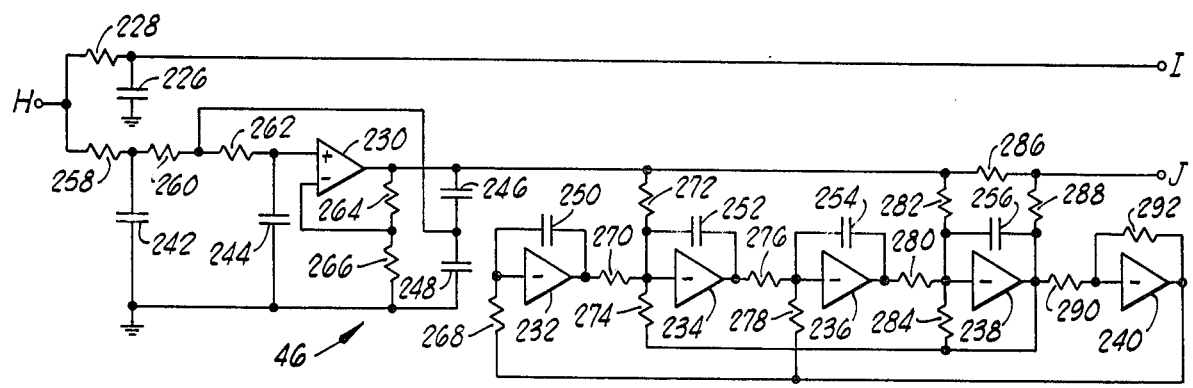

In FIG. 5, the log envelope signal 42 at terminal H is passed through the RC circuit comprised of capacitor 226 and resistor 228 to intermediate terminal I. The log envelope signal is also passed through a low pass time delay circuit, comprised of op-amps 230, 232, 234, 236, 238 and 240, capacitors 242, 244, 246, 248, 250, 252, 254 and 256, and resistors 258, 260, 262, 264, 266, 268, 270, 272, 274, 276, 278, 280, 282, 284, 286, 288, 290 and 292, to intermediate terminal J.

Figures 6, 7:
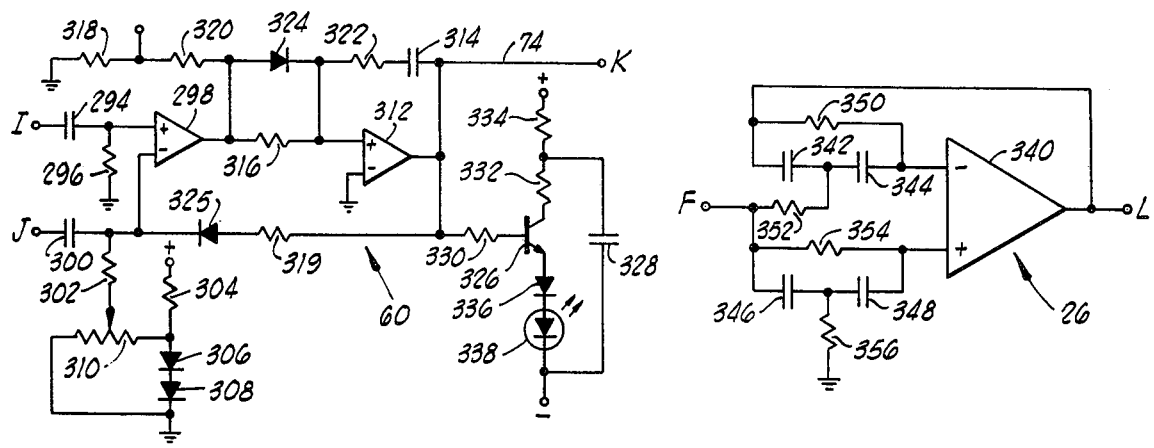

As shown in FIG. 6, the signal applied to the input terminal I is applied via capacitor 294 and resistor 296 to the positive input of op-amp 298 while the signal applied to the input terminal J is applied via capacitor 300, resistors 302 and 304, diodes 306 and 308, and potentiometer 310, to the negative input terminal of op-amp 298. The differential combination of these signals by op-amp 298 effectively achieves the convolution function described above and initiates the noise detection trigger pulse 62 when the threshold level 66 set by potentiometer 310 is exceeded. The op-amp 312, capacitor 314, resistors 316, 318, 319, 320 and 322 and diodes 324 and 325 complete the threshold trigger unit 60 and include a feedback path which tends to discourage a continuous "on" state as well as providing a latching effect. The junction between resistors 318 and 320 provides a convenient location to extract an output signal for audio indication of noise detection. The addition of transistor 326, capacitor 328, resistors 330, 332 and 334, diode 336 and light emitting diode 338 facilitates visual indication that a noise pulse has been detected. As described above, the detection signal 64 is output from the threshold trigger 60 via signal path 74 and intermediate terminal K is included for ease of reference.

FIG. 7 illustrates an active delay circuit comprised of the single op-amp 340, capacitors 342, 344, 346 and 348, and resistors 350, 352, 354 and 356, which provides a relatively constant group delay up to the limit of human hearing with negligible variation in frequency response. The circuit as shown provides up to 360° of phase shift and additional similar circuits may be cascaded to provide the desired delay period as described above. Since the circuit efficiently gives two real or complex poles and symmetric zeroes, it provides a flat response, limited only by component shortcomings, and assures unity gain at low frequencies independent of the RC tolerances without requiring trimming. Thus, the circuit as shown delays, for a predetermined time dependent upon component selection, the input signal 12 before it is output via intermediate terminal L as the delayed input signal 68.

Figures 8, 9:
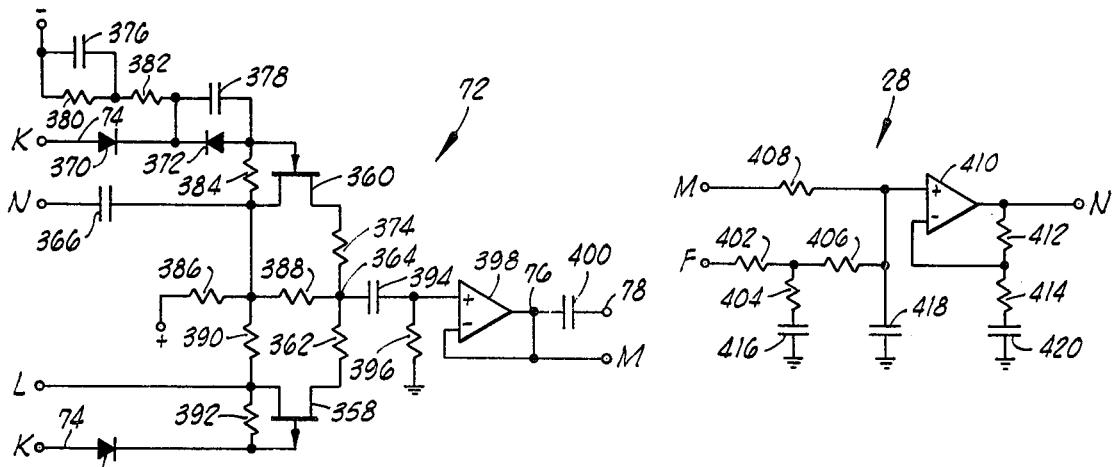

As shown in FIG. 8 and explained above, the detection signal 64 produced by the transient noise detection unit 24 is applied via signal path 74 and intermediate terminals K to the control input of electronic switch 72. In the normal operating state, the pair of complementary field effect transistors (FET) 358 and 360 are gated so that the delayed input signal 68, applied to the FET 358 via intermediate terminal L, is allowed to pass through FET 358 and resistor 362 to the basic switch output point 364. in this state, FET 360 is gated so that it does not pass the estimate signal applied via intermediate terminal N and capacitor 366. Upon application of the detection signal 64 via terminal K and diode 368, FET 358 turns "off" immediately thereby blocking the noise expected on the delayed input signal 68. The detection signal 64 is also applied indirectly via diodes 370 and 372 causing FET 360 to turn "on" and pass the estimate signal from signal estimation unit 28 through FET 360 and resistor 374 to switch output point 364. Thus, the application of detection signal 64 causes the output of electronic switch 72 to switch immediately from the delayed input signal 68 to the estimate signal constructed by signal estimation unit 28.

Upon the cessation of the detection signal 64, FET 358 immediately turns "on" and allows the delayed input signal 68 to pass again. However, FET 360 is maintained in the "on" state until capacitor 376 has discharged. Thus this momentary delay in disconnecting the estimate signal results in a short period of blending of the estimate signal and the delayed input signal 68. This blending has a smoothing effect which reduces reswitching noise due to phase or amplitude contrasts.

The capacitor 378 and resistors 380, 382, 384, 386, 388, 390 and 392 provide proper biasing and maintain the electronic switch 72 in a balanced conditions. From the basic switch output point 364, the output signal is applied via capacitor 394 and resistor 396 to the input of buffering op-amp 398. The final output signal 90 is applied via signal path 76 and coupling capacitor 400 to the output terminal 78. Output signal 90 is also made available for feedback to the signal estimation unit 28 via intermediate terminal M.

As shown in FIG. 9, the input signal 12 and the output signal 90, applied via intermediate terminals F and M respectively, are passed through the resistor bridge comprised of resistors 402, 404, 406 and 408 and summed as input to op-amp 410. Effectively, gain factors of K and (1−K) are applied to input signal 12 and output signal 90 respectively, before the sum is applied to op-amp 410. Op-amp 410, resistors 412 and 414 and the combined effects of capacitors 416, 418, and 420 provide the minimum phase low pass filter function described generally above.

In the signal estimation unit 28 therefore, the output signal 90, which is in the normal state merely the delayed input signal 68, can be blended with a much smaller amount of the raw input signal 12, which is the relative "future," and the sum spread back in time by the minimum phase low pass filter so as to average the relative "present." During the interval of a detected noise pulse, the delayed input signal 68 is disconnected from the output signal 90 and its influence decays as a transient through the feedback circuit including the low pass filter 88 of estimation unit 28. However, the input signal 12 is reinforced through the feedback circuit and thus bootstraps itself until it eventually predominates the output signal 90. The possibility of step noise on switchback to the delayed input signal 68 is minimized by the gradual return switching of electronic switch 72 to allow a compensating period of blending.

Changes may be made in the construction and the arrangement of the components or the units of the various embodiments as disclosed herein without departing from the spirit and scope of the invention as defined in the following claims.

What is claimed is:

1. A method for substantially eliminating transient noise pulses in an input signal, comprising the steps of:
   receiving the input signal containing transient noise pulses;
   producing a first signal through filtering of the input signal within selected frequency limits;
   producing a second signal by detecting the absolute amplitude envelope of the first signal;
   developing an envelope signal from said second signal and convolving said envelope signal with a predetermined filter function to generate a convolution signal;
   detecting pulses in the convolution signal which have predetermined pulse amplitude and duration characteristics;
   producing a detection signal when one of said pulses is detected;
   receiving the input signal and producing a third signal delayed relative to the input signal by a preselected duration;
   receiving the input signal and producing a fourth signal which is a time weighted estimate of the third signal in time versus amplitude; and
   switching between the third signal and fourth signal as controlled in response to production of said detection signal to produce an output signal.

2. The method of claim 1 wherein the first signal is produced through frequency filtering that accentuates the transient noise pulses.

3. The method of claim 1 wherein the first signal is produced by a frequency filtering function accentuating low frequencies.

4. The method of claim 1 wherein the step of producing a second signal is further characterized as producing said second signal related to the logarithmic function of the envelope of the first signal.

5. The method of claim 1 wherein the step of producing a second signal is further characterized as including the steps of:
   producing a fifth signal related to the absolute value function of the first signal; and
   producing said second signal related to the envelope of the fifth signal.

6. The method of claim 1 wherein the step of producing a second signal is further characterized as including the steps of:
   producing a fifth signal related to the absolute valve function of the first signal;
   producing a sixth signal related to the logarithmic function of the fifth signal; and
   producing said second signal related to the envelope of the sixth signal.

7. The method of claim 1 wherein the step of producing a detection signal is further characterized as producing said detection signal when the level of the convolution signal exceeds a predetermined threshold level.

8. The method of claim 7 wherein the predetermined threshold level varies as a function of the envelope of a predetermined set of frequencies of the input signal.

9. The method of claim 7 wherein the level of the detection signal varies as a function of the amount that the level of the convolution signal exceeds the predetermined threshold level.

10. The method of claim 7 wherein the step of producing a detection signal is further characterized as producing said detection signal for at least as long as the level of the convolution signal exceeds a predetermined threshold level.

11. The method of claim 1 wherein the third signal is delayed relative to the input signal and related thereto by a constant gain factor.

12. The method of claim 1 wherein the step of producing a fourth signal is further characterized as producing said fourth signal related to the input signal, by blending portions of the input signal preceding and following a predetermined time segment of the input signal according to a continuously varying weighting function.

13. The method of claim 12 wherein the weighting function is related to the autocorrelation function of the input signal.

14. The method of claim 12 wherein the duration of the predetermined time segment varies as a function of the detection signal.

15. The method of claim 1 wherein the step of producing a fourth signal is further characterized as including the steps of:
   producing a fifth signal related to the input signal by a fifth function having a predetermined gain of K, where $0 \leq K \leq 1$;
   producing a sixth signal related to the output signal by a sixth function having a predetermined gain of (1-K); and
   producing a fourth signal related to the sum of the fifth and sixth signals of a seventh function, the fourth signal being an estimate of the third signal.

16. A method for substantially eliminating transient noise pulses in an input signal, comprising the steps of:
   receiving the input signal containing transient noise pulses;
   receiving an alternate input signal containing transient noise pulses whose occurrence times are substantially the same as the occurrence times of the transient noise pulses in the input signal;
   producing a first signal through filtering of the alternate input signal within selected frequency limits;

producing a second signal by detecting the absolute amplitude envelope of the first signal;

developing an envelope signal from said second signal and convolving said envelope signal with a predetermined filter function to generate a convolution signal;

detecting pulses in the convolution signal which have predetermined pulse amplitude and duration characteristics;

producing a detection signal when one of said pulses is detected;

receiving the input signal and producing a third signal delayed relative to the input signal by a preselected duration;

receiving the input signal and producing a fourth signal which is a time weighted estimate of the third signal in time versus amplitude; and switching between the third signal and fourth signal as controlled in response to production of said detection signal to produce an output signal.

17. A circuit for substantially eliminating transient noise pulses in an input signal, comprised of:

frequency filtering means receiving the input signal and producing a first signal containing those frequencies of the input signal likely to contain significant components of the transient noise pulses;

absolute value determining means receiving the first signal and producing a second signal related to the absolute value function of the first signal;

envelope determining means receiving the second signal and producing a third signal related to a function of the envelope of the positive portion of the second signal;

pulse shape discriminating means receiving the third signal and producing a fourth signal related to the convolution of the third signal with a predetermined filter function;

threshold trigger means receiving the fourth signal and producing a detection signal when the level of the fourth signal exceeds a predetermined threshold level;

time delay means receiving the input signal and producing a delayed input signal related to the input signal by a predetermined time delay; and, output means receiving the input signal, the delayed input signal and the detection signal, having a gating portion for producing an output signal varying between the delayed input signal and an estimate signal, as a function of the level of the detection signal, and a signal estimating portion for producing the estimate signal as a function of the input signal and the output signal, the estimate signal being an estimate of the delayed input signal.

18. A circuit as set forth in claim 17 wherein said envelope determining means comprises:

means receiving said second signal and producing a third signal related to a logarithmic function of said envelope.

19. A circuit as set forth in claim 17 wherein said pulse shape discriminating means comprises:

cross-correlation circuit means receiving and convolving said third signal in accordance with a predetermined filter function to produce said fourth signal.

* * * * *